United States Patent
Tanaka et al.

(10) Patent No.: US 10,854,537 B2
(45) Date of Patent: Dec. 1, 2020

(54) POWER SEMICONDUCTOR DEVICE AND POWER MODULE

(71) Applicant: Mitsubishi Electric Corporation, Tokyo (JP)

(72) Inventors: Saburo Tanaka, Tokyo (JP); Tomoaki Shimano, Tokyo (JP); Masaki Kato, Tokyo (JP); Jun Tahara, Tokyo (JP); Tatsuya Fukase, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 5 days.

(21) Appl. No.: 16/124,932

(22) Filed: Sep. 7, 2018

(65) Prior Publication Data

US 2019/0318977 A1 Oct. 17, 2019

(30) Foreign Application Priority Data

Apr. 11, 2018 (JP) .................................. 2018-075834

(51) Int. Cl.
*H01L 23/495* (2006.01)
*H01L 23/498* (2006.01)
(Continued)

(52) U.S. Cl.
CPC .. *H01L 23/49562* (2013.01); *H01L 23/49575* (2013.01); *H01L 23/49861* (2013.01); *H01L 25/0655* (2013.01); *H01L 25/115* (2013.01)

(58) Field of Classification Search
CPC ............... H01L 25/115; H01L 25/0655; H01L 23/49562; H01L 23/49575
See application file for complete search history.

(56) References Cited

U.S. PATENT DOCUMENTS

| | | | |
|---|---|---|---|
| 4,706,105 A * | 11/1987 | Masuda | H01L 21/565 257/695 |
| 2006/0051986 A1 * | 3/2006 | Asai | H01R 13/2442 439/71 |
| 2015/0097470 A1 | 4/2015 | Sasaki et al. | |

FOREIGN PATENT DOCUMENTS

| | | |
|---|---|---|
| JP | 3-283650 A | 12/1991 |
| JP | 2013-188027 A | 9/2013 |

(Continued)

OTHER PUBLICATIONS

Communication dated May 21, 2019 from Japanese Patent Office in counterpart JP Application No. 2018-075834.

*Primary Examiner* — Amar Movva
(74) *Attorney, Agent, or Firm* — Sughrue Mion, PLLC; Richard C. Turner

(57) ABSTRACT

Provided is a small-sized power semiconductor device in which interference between power modules adjacently disposed is prevented and the areas of the gaps occurring between the power modules are reduced. In a power semiconductor device formed by adjacently disposing power modules in an arc shape on a heat sink, each of which power modules is obtained by sealing, with a mold resin, a switchable power semiconductor chip, a lead frame in which potential leads and signal terminals connected to the power semiconductor chip are formed, and a metallic inner lead electrically connecting an upper surface electrode of the power semiconductor chip and the lead frame, any one of the adjacent power modules is formed in a pentagonal shape having, at a portion adjacent to the other power module, an oblique side 10a obtained by cutting out one corner of a quadrangle.

11 Claims, 5 Drawing Sheets

(51) Int. Cl.
H01L 25/065 (2006.01)
H01L 25/11 (2006.01)

(56) References Cited

FOREIGN PATENT DOCUMENTS

| | | |
|---|---|---|
| JP | 2016-82056 A | 5/2016 |
| JP | 6038230 B1 | 12/2016 |
| JP | 2017-199827 A | 11/2017 |

\* cited by examiner

POWER SEMICONDUCTOR DEVICE AND POWER MODULE

BACKGROUND OF THE INVENTION

1. Field of the Invention

The present disclosure relates to a power semiconductor device and a power module for use in the power semiconductor device.

2. Description of the Background Art

In a power semiconductor device, a plurality of power modules each including a switchable power semiconductor chip therein and mounted on a heat sink are combined, thereby forming a power conversion circuit.

In the power semiconductor device, a signal is transmitted from a control board included therein in addition to the power conversion circuit, to the power conversion circuit, and each power semiconductor chip is turned on and off, thereby controlling power. The power semiconductor device includes a smoothing capacitor for absorbing voltage variation and noise generated at that time.

In addition, during operation of the power semiconductor device, power is transmitted via a bus bar, which is formed from a metallic plate and which connects a power source, the power modules, and the smoothing capacitor, between these components.

As the power conversion circuit, a three-phase circuit is formed. For example, in the case where two three-phase circuits are disposed in parallel, it is possible to reduce electromagnetic sound and smooth variation in driving torque when the three-phase circuits are connected to a motor and operated.

Each power module is obtained by mounting a power semiconductor chip on a lead frame formed in a wiring pattern shape, connecting an upper surface electrode pad of the power semiconductor chip by a wiring member, and sealing these components with a mold resin.

A power conversion circuit is formed by mounting a plurality of the power modules on a heat sink, but it is necessary to efficiently dispose the power modules in order to provide a small-sized power semiconductor device.

In order to form an n-phase power conversion circuit, for example, in the case where a circuit for one phase is formed by one power module, it is necessary to dispose n power modules on a heat sink, and the size of a power semiconductor device is determined by the outer size of each power module.

For example, Patent Document 1 discloses the structure of a power semiconductor device equipped with power modules for n phases.

In the power semiconductor device, n power modules for forming an n-phase bridge circuit are disposed in an arc shape on a shared heat sink provided to a rotary electric machine body.

Patent Document 1: Japanese Patent No. 6038230

However, in the power semiconductor device disclosed in Patent Document 1, each power module has a rectangular shape, and it is necessary to dispose the power modules such that the power modules do not interfere with each other even when the power modules are disposed in an arc shape so as to be close to each other.

For example, in the case where n power modules having a rectangular shape are disposed in an arc shape, when each of the lengths of the short sides of power modules A and B which extend in a direction perpendicular to the inner circumference of the arc is denoted by L as shown in FIG. 7, even in a state where the power modules A and B are made closest to each other, a triangular gap C having a size with a base length of $2 \times L \times \sin(360/2/n)$ and a height of $L \times \cos(360/2/n)$ occurs between the power modules A and B.

As a result, the necessity to provide a gap having a size equal to or larger than $n \times L \times \sin(360/2/n) \times \cos(360/2/n)$ in total between the power modules A and B arises, which impedes size reduction of the power semiconductor device.

SUMMARY OF THE INVENTION

The present disclosure is conceived in order to solve the above conventional problems, and an object of the present disclosure is to provide a small-sized power semiconductor device in which interference between a plurality of power modules adjacently disposed is prevented and the areas of the gaps occurring between the power modules are reduced.

The power semiconductor device according to one aspect of the present disclosure is a power semiconductor device formed by adjacently disposing a plurality of power modules in an arc shape on a heat sink, each power module being obtained by sealing, with a mold resin, a switchable power semiconductor chip, a lead frame in which a potential lead and a signal terminal connected to the power semiconductor chip are formed, and a metallic inner lead electrically connecting an upper surface electrode of the power semiconductor chip and the lead frame, wherein any one of the adjacent power modules is formed in a pentagonal shape having, at a portion adjacent to the other power module, an oblique side obtained by cutting out one corner of a quadrangle.

The power semiconductor device according to one aspect of the present disclosure can be realized as a small-sized power semiconductor device that is formed by adjacently disposing a plurality of power modules and in which interference between the adjacent power modules is prevented and the areas of the gaps occurring between the power modules are reduced.

DETAILED DESCRIPTION OF THE PREFERRED EMBODIMENTS OF THE INVENTION

First Embodiment

Hereinafter, a first embodiment of the present disclosure will be described with reference to FIGS. 1 to 5.

Figure 1:
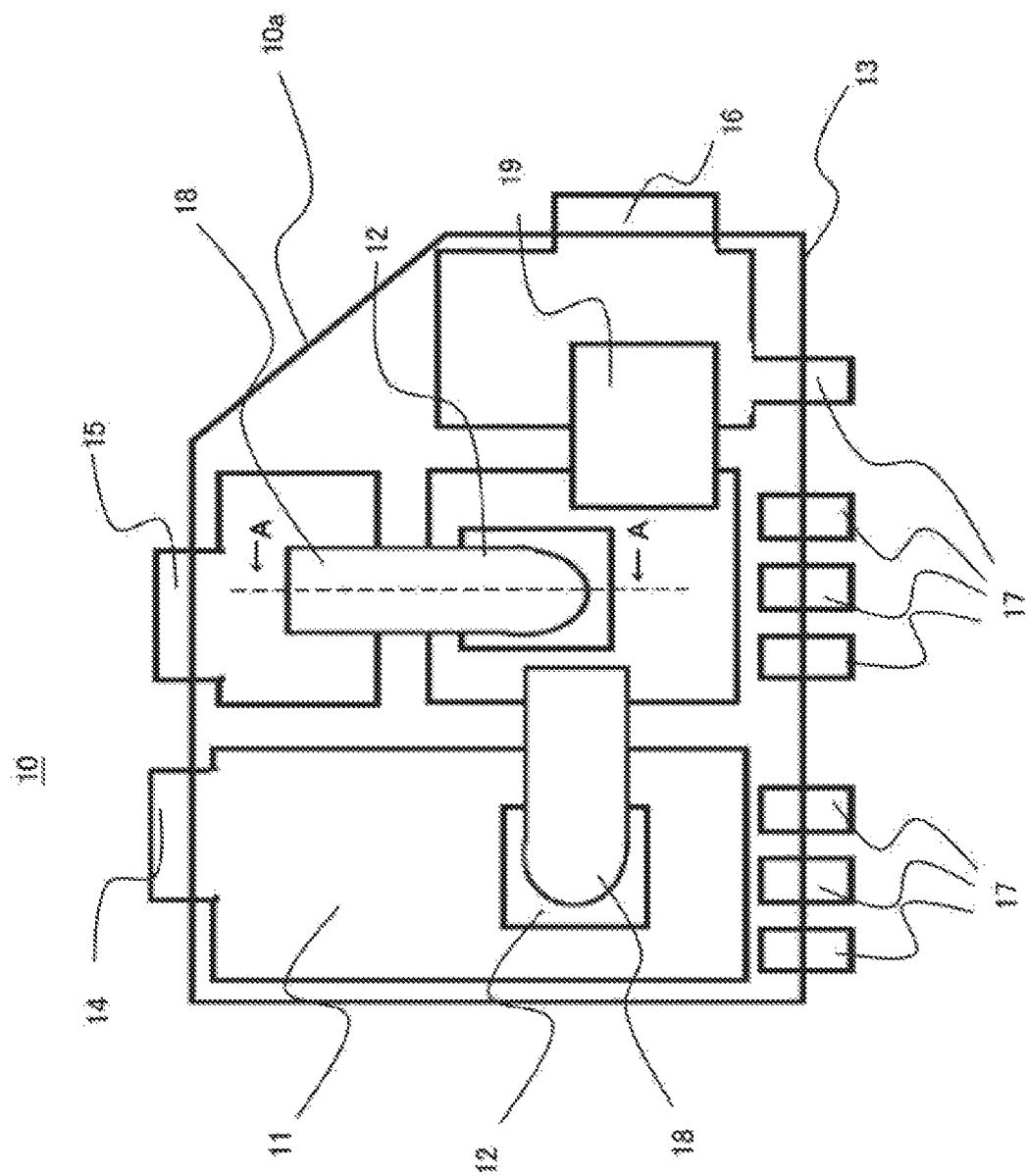
FIG. 1 is an external schematic perspective view of a power module for use in a power semiconductor device according to a first embodiment of the present disclosure, as seen from above a mold resin.
Figure 2:
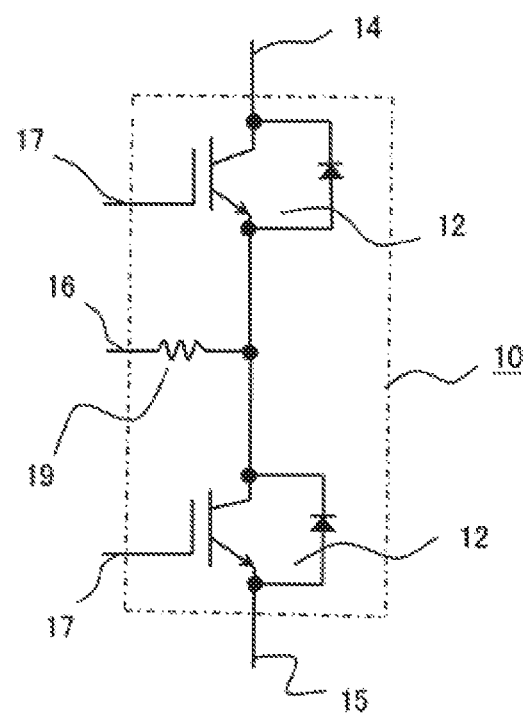
FIG. 2 is a diagram showing a circuit for one power module according to the first embodiment.

FIG. 1 is an external schematic perspective view of a power module 10 for use in a power semiconductor device 100 according to the first embodiment, as seen from above a mold resin 13. FIG. 2 is a diagram showing a bridge circuit formed by one power module 10.

The power module 10 includes: a metallic lead frame 11 formed in a wiring pattern shape; two power semiconductor chips 12 connected on the lead frame 11; and the mold resin 13 disposed so as to cover a part of the lead frame 11 and the power semiconductor chips 12.

The power module 10 includes therein a P potential lead 14 and an AC potential lead 16 that are formed by being separated from the lead frame 11 and equipped with the power semiconductor chips 12, and an N potential lead 15 that is not equipped with a power semiconductor chip.

In FIG. 1, the power module 10 is formed such that the outer shape of the mold resin 13 is a pentagonal shape having an oblique side 10a obtained by cutting out one corner of a quadrangle, the P potential lead 14 and the N potential lead 15 are disposed at the short side connected to the oblique side 10a, and signal terminals 17 are disposed at the long side opposing the short side connected to the oblique side 10a.

Figure 3:
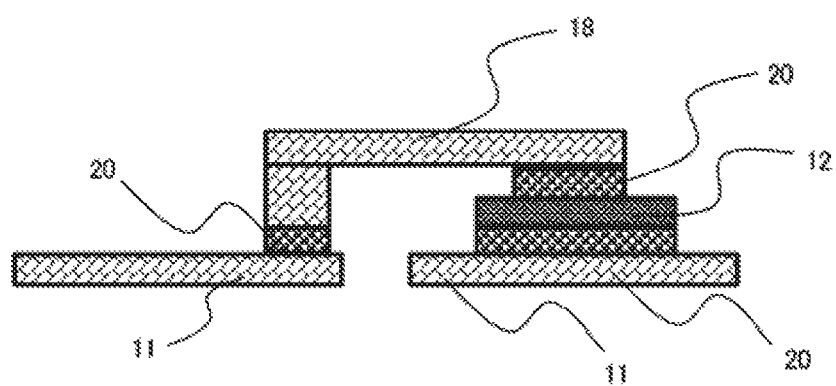
FIG. 3 is a cross-sectional view taken along a line A-A in FIG. 1.

As shown in FIG. 3, the lead frame 11 is obtained by forming a plate of an alloy including copper or aluminum as a base, into a wiring pattern shape. On one side of the lead frame 11, the power semiconductor chips 12, conductive members 20 such as solder, inner leads 18, wire-bonding wiring (not shown), a current detection resistor (not shown), and the like are mounted and sealed so as to be covered with the mold resin 13, and then a part that is unnecessary for electric wiring is removed.

Accordingly, the lead frame 11 is separated, and the P potential lead 14, the N potential lead 15, and the AC potential lead 16 are formed as shown in FIG. 1, so that a structure in which these components are over-molded with a transfer mold resin is provided.

Etching or pressing of a plate-like material is used for processing into a wiring pattern shape for the lead frame 11, and a lead frame having a metallic base exposed on the surface thereof can be used, but a lead frame that is at least partially plated can also be used.

Each power semiconductor chip 12 includes a chip upper surface electrode and a chip lower surface electrode on an upper surface and a lower surface thereof, respectively.

In the present embodiment, a MOSFET is shown as one example of the power semiconductor chip 12, but the power semiconductor chip 12 can also be applied to an IGBT. The MOSFET and the IGBT are switchable elements and each include a gate portion and a gate electrode on the chip upper surface in addition to the chip upper surface electrode.

The gate electrode is electrically connected by means of wire bonding to a gate terminal formed by a part of the lead frame (not shown).

As the power semiconductor chip 12, not only a chip produced using Si but also a chip produced using SiC, SiN, GaN, GaAs, or the like can be used.

In addition, in the case of using a wiring member such as an inner lead, the upper surface electrode of the power semiconductor chip 12 has specifications that allow soldering, for example, has a Ni plated layer for joining with a conductive member such as solder.

In the present embodiment, the chip upper surface electrode of each power semiconductor chip 12 and each inner lead 18, each inner lead 18 and the lead frame 11, and the chip lower surface electrode of each power semiconductor chip 12 and the lead frame 11, are connected to each other by solder.

In the present embodiment, a current detection resistor 19 is provided as an electronic component near the inner lead 18.

The solder between each power semiconductor chip 12, each inner lead 18, the current detection resistor 19, and the lead frame 11 can be joined by batch heat treatment with a reflow device or the like, and thus the productivity can be improved.

For example, in the case where strain may occur due to a temperature change or the like during use of the power semiconductor device 100 and thus a difference in durability may be created due to a solder joined portion, solder having a different composition may be used for each location to which solder is to be applied.

In the present embodiment, solder is shown as an example of the conductive member 20, but not only a conductive resin paste but also a sintering paste may be used.

Figure 4:
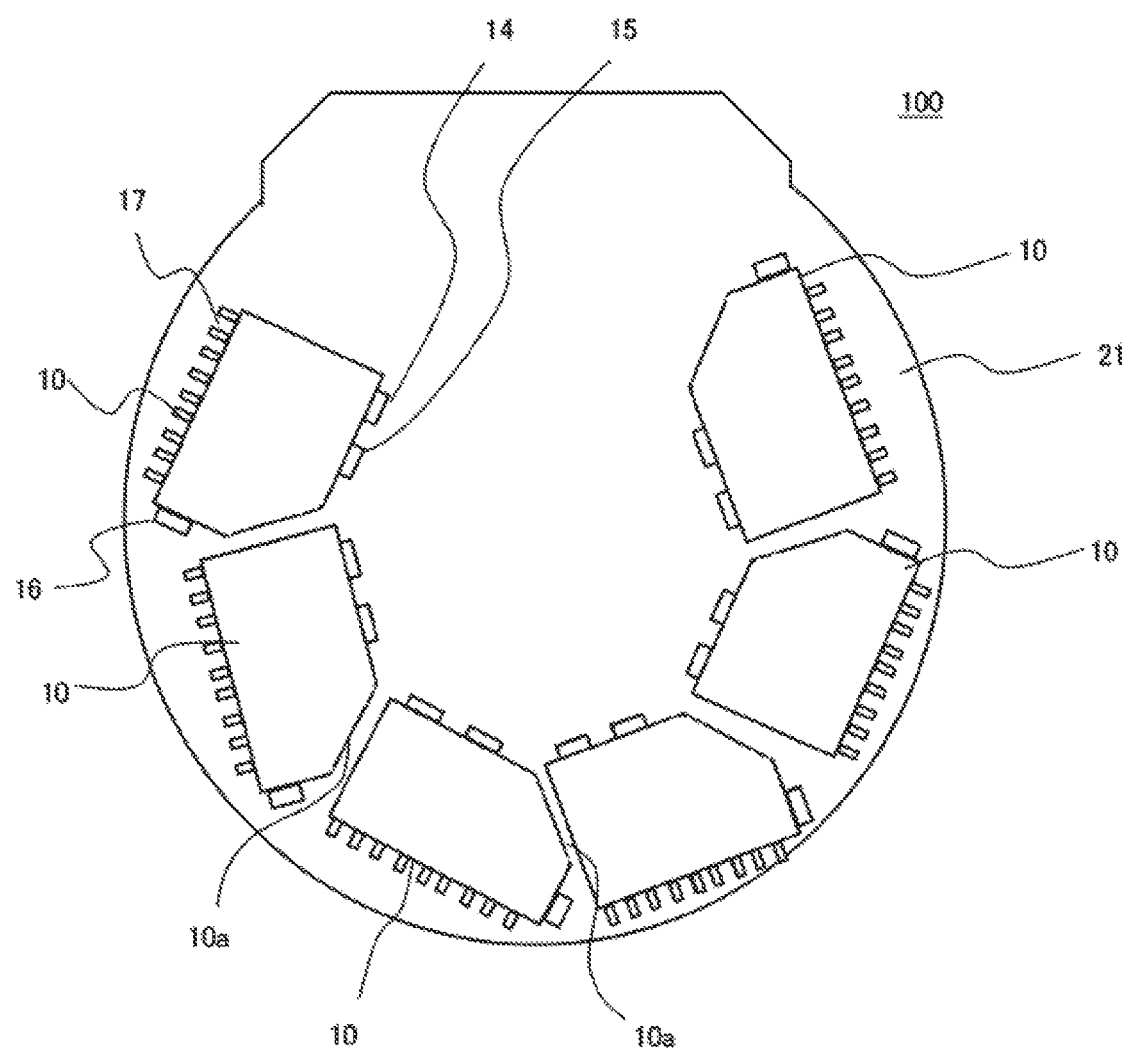
FIG. 4 is an external schematic view showing the power semiconductor device according to the first embodiment.
Figure 7:
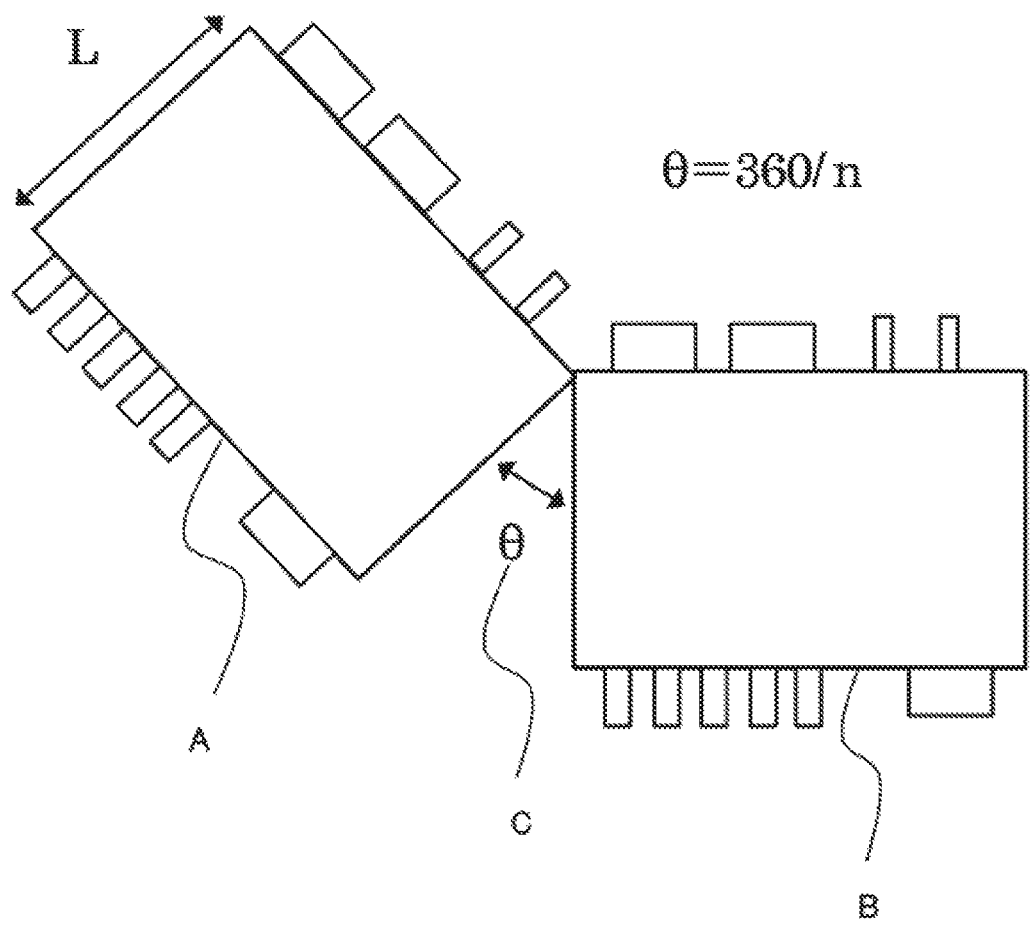
FIG. 7 illustrates the case where conventional power modules are disposed in an arc shape.

In the present embodiment, since the outer shape of the power module 10 is formed as a pentagonal shape having an oblique side obtained by cutting out one corner of a quadrangle, in the case where the power semiconductor device 100 corresponding to a pair of three-phase inverters is formed by adjacently disposing six power modules 10 in an arc shape on a shared heat sink 21 provided to a rotary electric machine body as shown in FIG. 4, unlike the case where rectangular power modules having no cutout are disposed in an arc shape as shown in FIG. 7, it is possible to dispose the power modules 10 such that the power modules 10 are closer to each other by an amount equivalent to the cutout of the one corner of the quadrangle, and thus the gap between the two power modules 10, 10 adjacent to each other can be reduced as compared to that in the case as shown in FIG. 7.

Figure 5:
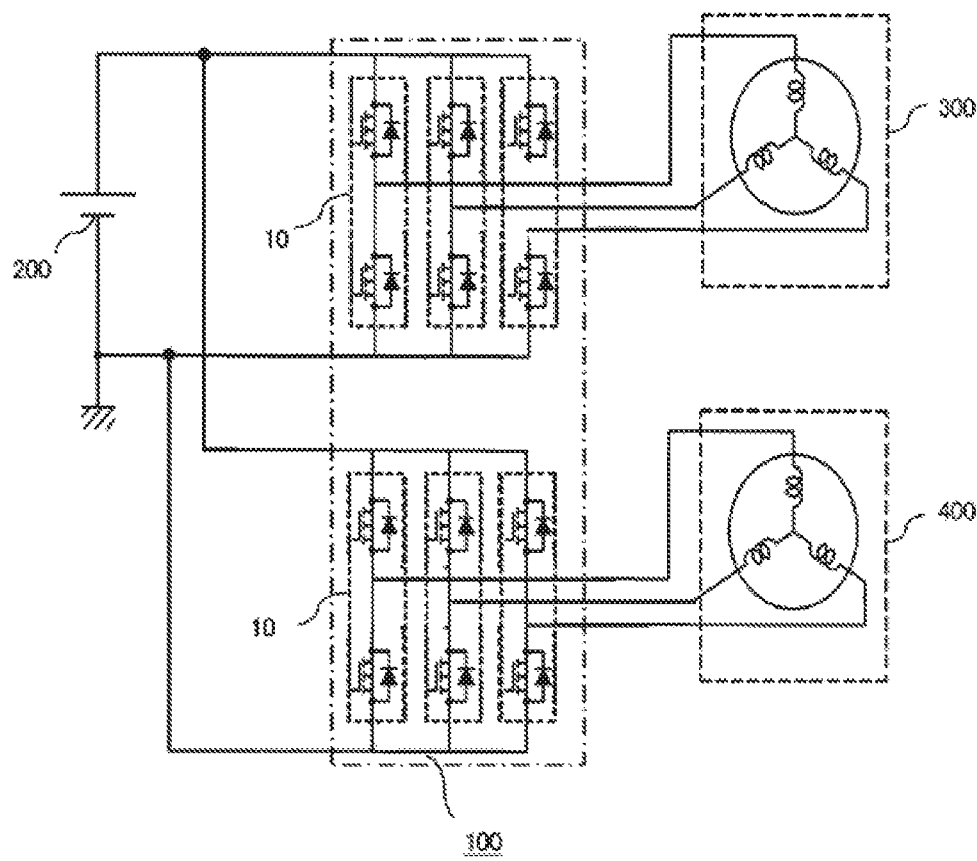
FIG. 5 is a circuit diagram showing an example in which the power semiconductor device according to the first embodiment is used.

FIG. 5 is a circuit diagram showing an example in which the power semiconductor device 100 corresponding to a pair of three-phase inverters is used, and illustrates an example in which two three-phase AC motors 300 and 400 are driven by a DC power source 200 via a pair of three-phase inverter circuits formed by the power semiconductor device 100.

Furthermore, in the present embodiment, in the case where six power modules 10 are disposed in an arc shape on the heat sink 21 as shown in FIG. 4, each power module 10 has a structure in which the P potential lead 14 and the N potential lead 15 are disposed at the short side connected to the oblique side 10a obtained by cutting out one corner of a quadrangle, and the signal terminals 17 are disposed at the long side opposing the short side connected to the oblique side 10a.

Accordingly, when n power modules for forming an n-phase bridge circuit are disposed in an arc shape on a heat sink, signal terminals are disposed at the outer circumferential side of the arc formed by the power modules, and potential leads are disposed at the inner circumferential side of the arc, so that soldering regions where soldering is to be performed when connecting the signal terminals to a control board are provided in a concentrated manner at an outer peripheral portion of a power semiconductor device. Thus, component mounting prohibition regions that occur together with the soldering regions and are near the soldering regions can be reduced, and component mounting regions that need to be ensured for mounting components so as to avoid the component mounting prohibition regions can be reduced, so that the power semiconductor device can be formed to have a small size.

Figure 6:
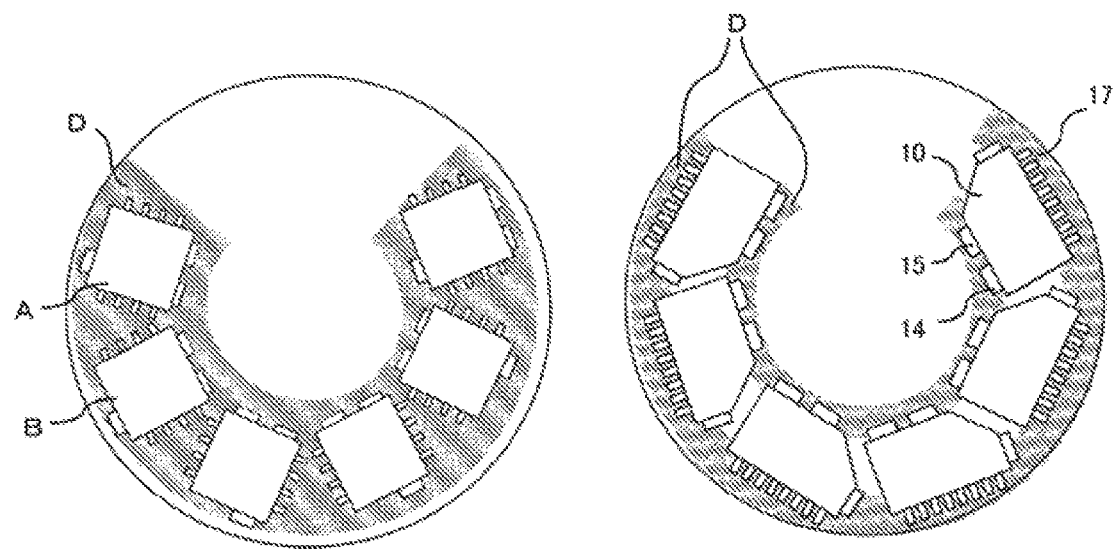
FIG. 6 is a schematic diagram for showing component mounting prohibition regions in a conventional power semiconductor device and in the power semiconductor device according to the first embodiment.

In other words, since the signal terminals and the potential leads of the power modules are connected to the control board via solder so as to extend through through-holes or the like provided in the control board, in the case where the signal terminals and potential lead terminals of the power modules are disposed at four sides of power modules A and B as shown in the left part of FIG. 6, even when electronic components are disposed in a region inward of the terminals of the power modules connected to the control board, it is difficult to electrically connect the electronic components to a region outward of the terminals. Thus, the electronic components cannot be disposed inward of the terminals, and components cannot be mounted in an area inward of the terminals and an area including areas around the terminals, so that the area around the entire outer shape of each power module is a component mounting prohibition region D in the area of the control board connected to the power modules.

However, by disposing the potential leads 14 and 15 at the inner peripheral side of the power module 10 and disposing the signal terminals 17 at the outer peripheral side of the power module 10 as in the present embodiment, even when electronic components are disposed in the region inward of the terminals, component mounting prohibition regions D merely need to be set at only the inner peripheral side and the outer peripheral side of the power module 10 as shown in the right part of FIG. 6, and it is possible to ensure electric connection within band-like regions that are formed by the signal terminals 17 and the potential leads 14 and 15 and correspond to an outer peripheral portion of the power semiconductor device.

Since the soldering regions can be provided in a concentrated manner at the outer peripheral portion of the power semiconductor device, locations where soldering is to be performed are limited, so that soldering is made easier and a power semiconductor device having high productivity can be supplied.

Since it is possible to adjacently dispose the P potential lead 14 and the N potential lead 15, noise generated when a current is applied is reduced, no influence on the surrounding electronic components and electric circuits occurs, and a noise shield for preventing influence of noise becomes unnecessary, so that the power semiconductor device can be formed to have a small size.

As described above, according to the power semiconductor device disclosed in the present disclosure, in a power semiconductor device formed by adjacently disposing a plurality of power modules in an arc shape on a heat sink, each of which power modules is obtained by sealing, with a mold resin, a switchable power semiconductor chip, a lead frame in which a potential lead and a signal terminal connected to the power semiconductor chip are formed, and a metallic inner lead electrically connecting an upper surface electrode of the power semiconductor chip and the lead frame, any one of the adjacent power modules is formed in a pentagonal shape having, at a portion adjacent to the other power module, an oblique side obtained by cutting out one corner of a quadrangle. Thus, it is possible to dispose the adjacent power modules at a narrow interval and reduce the area of the gap occurring between the power modules, so that a small-sized power semiconductor device can be formed.

According to the power semiconductor device disclosed in the present disclosure, a P potential lead and an N potential lead connected to the power semiconductor chip are disposed at a side corresponding to the inner peripheral side of each of the power modules disposed in an arc shape. Thus, the P potential lead and the N potential lead can be disposed at a narrow interval, noise generated when a current is applied is reduced, no influence on the surrounding electronic components and electric circuits occurs, and a noise shield for preventing influence of noise becomes unnecessary, so that a small-sized power semiconductor device can be formed.

According to the power semiconductor device disclosed in the present disclosure, the signal terminal connected to the power semiconductor chip is disposed at the side corresponding to the outer peripheral side of each of the power modules disposed in an arc shape. Thus, it is possible to adjacently dispose the power modules at a narrow interval while signal terminals the number of which is large are disposed in a concentrated manner at the outer peripheral side. By disposing the signal terminals in a concentrated manner, soldering regions where soldering is to be performed when connecting the signal terminals to a control board are provided in a concentrated manner at the outer peripheral portion of the power semiconductor device. Thus, component mounting prohibition regions that occur together with the soldering regions and are near the soldering regions can be reduced, and component mounting regions that need to be ensured for mounting components so as to avoid the component mounting prohibition regions can be reduced, so that a small-sized power semiconductor device can be formed.

The power semiconductor device disclosed in the present disclosure has a structure in which the entirety including not only a substrate but also the chip and wiring are over-molded with a transfer mold resin. Thus, by forming the outer shape of each power module as a shape in which there is no corner having an angle less than 90 degrees, releasability from a mold during molding is good, and the productivity is excellent.

Furthermore, in the power semiconductor device disclosed in the present disclosure, each power module is formed such that a wiring pattern shape for a substrate is formed by the lead frame, and has a structure in which the substrate and electronic components mounted thereon are mold-sealed with a transfer mold resin. Thus, by forming the outer shape of the mold resin as a pentagonal shape, even when any shape is selected as the wiring pattern shape in which a semiconductor chip and electronic components are mounted, it is possible to dispose the power modules in an arc shape, since the outer shape formed by the mold resin is a pentagonal shape.

Although the disclosure is described above in terms of an exemplary embodiment, it should be understood that the various features, aspects and functionality described in the embodiment are not limited in their applicability to the particular embodiment with which they are described, but instead can be applied alone or in various combinations to the embodiment of the disclosure.

It is therefore understood that numerous modifications which have not been exemplified can be devised without departing from the scope of the present disclosure. For example, at least one of the constituent components may be modified, added, or eliminated.

DESCRIPTION OF THE REFERENCE CHARACTERS

100 power semiconductor device
10 power module
10a oblique side
11 lead frame
12 power semiconductor chip 13 mold resin
14 P potential lead
15 N potential lead
16 AC potential lead
17 signal terminal
18 inner lead
19 current detection resistor
20 conductive member
21 heat sink
200 DC power source
300, 400 three-phase AC motor

What is claimed is:

1. A power semiconductor device formed by adjacently disposing a plurality of power modules in along an arc on a heat sink, each power module being obtained by sealing, with a mold resin, a switchable power semiconductor chip, a lead frame in which a potential lead and a signal terminal connected to the power semiconductor chip are formed, and a metallic inner lead electrically connecting an upper surface electrode of the power semiconductor chip and the lead frame, wherein
any one of the adjacent power modules is formed in a pentagonal shape having, at a portion adjacent to the other power module, an oblique side obtained by cutting out one corner of a quadrangle, and
the signal terminal is disposed at a side corresponding to a radially outer peripheral side of each of the power modules with respect to a radius of the arc.

2. The power semiconductor device according to claim 1, wherein the potential lead is disposed at a side corresponding to an inner peripheral side of each of the power modules.

3. The power semiconductor device according to claim 2, wherein each of the power modules includes a bridge circuit for one phase, and the n power modules are disposed in an arc shape on a shared heat sink to form an n-phase bridge circuit.

4. The power semiconductor device according to claim 3, wherein the mold resin is a transfer mold resin, and the power semiconductor chip, the lead frame, and the inner lead are over-molded therewith.

5. The power semiconductor device according to claim 2, wherein the mold resin is a transfer mold resin, and the power semiconductor chip, the lead frame, and the inner lead are over-molded therewith.

6. The power semiconductor device according to claim 1, wherein each of the power modules includes a bridge circuit for one phase, and the n power modules are disposed in an arc shape on a shared heat sink to form an n-phase bridge circuit.

7. The power semiconductor device according to claim 6, wherein the mold resin is a transfer mold resin, and the power semiconductor chip, the lead frame, and the inner lead are over-molded therewith.

8. The power semiconductor device according to claim 1, wherein the mold resin is a transfer mold resin, and the power semiconductor chip, the lead frame, and the inner lead are over-molded therewith.

9. A power module comprising:
a switchable power semiconductor chip;
a lead frame in which a potential lead and a signal terminal connected to the power semiconductor chip are formed;
a metallic inner lead electrically connecting an upper surface electrode of the power semiconductor chip and the lead frame;
a conductive joining member joining at least the lead frame and the inner lead together; and
a mold resin covering the power semiconductor chip, the lead frame, and the inner lead, wherein
an outer shape of the mold resin is formed as a pentagonal shape having an oblique side obtained by cutting out one corner of a quadrangle,
wherein the signal terminal is disposed at a long side opposing a short side connected to the oblique side.

10. The power module according to claim 9, wherein the potential lead is disposed at the short side connected to the oblique side.

11. The power module according to claim 9, wherein the mold resin is a transfer mold resin, and the power semiconductor chip, the lead frame, and the inner lead are over-molded therewith.

* * * * *